United States Patent [19]
Lee et al.

[11] Patent Number: 5,227,992
[45] Date of Patent: Jul. 13, 1993

[54] OPERATIONAL METHOD AND APPARATUS OVER GF($2^m$) USING A SUBFIELD GF($2^{m/2}$)

[75] Inventors: Man-young Lee; Jae-mun Kim; Hak-song Park; Hyeong-keun An, all of Seoul; Heung-yeol Yeom, Taejeon, all of Rep. of Korea

[73] Assignee: Samsung Electronics Co., Ltd., Kyunggi-do, Rep. of Korea

[21] Appl. No.: 717,506

[22] Filed: Jun. 19, 1991

[30] Foreign Application Priority Data

Mar. 20, 1991 [KR] Rep. of Korea .................. 91-4391

[51] Int. Cl.[5] .............................. G06F 7/00
[52] U.S. Cl. .............................. 364/746.1
[58] Field of Search .................. 364/746.1, 746

[56] References Cited

U.S. PATENT DOCUMENTS

| | | | |
|---|---|---|---|
| 4,162,480 | 7/1974 | Berlekamp | 364/746.1 X |
| 4,251,875 | 2/1981 | Marver et al. | 364/746.1 |
| 4,847,801 | 7/1989 | Tong | 364/746.1 |
| 4,949,294 | 8/1990 | Wambergue | 364/746 |
| 4,975,867 | 12/1990 | Weng | 364/746.1 |
| 4,989,171 | 1/1991 | Hollmann | 364/746.1 |

OTHER PUBLICATIONS

Itoh et al., "Effective Recursive Algorithm for Computing Multiplicative Inverses in GF($2^m$)" *Electronics Letters* 17th Mar. 1988, vol. 24, No. 6, pp. 334–335.

*Primary Examiner*—Tan V. Mai
*Attorney, Agent, or Firm*—Rothwell, Figg, Ernst & Kurz

[57] ABSTRACT

An operation method and apparatus over Galois Field GF($2^m$) using a subfield GF($2^{m/2}$). The operation apparatus includes a conversion circuit for converting the elements represented by a basis of GF($2^m$) into the elements represented by a basis of GF($2^{m/2}$); an operation circuit for performing an operation over GF($2^{m/2}$) with respect to the elements represented by the basis of GF($2^{m/2}$); and a reversion circuit for reverting the operated elements represented by the basis of GF($2^{m/2}$) to the elements represented by the basis of GF($2^m$), thereby performing high speed operation and simplifying circuit construction.

15 Claims, 8 Drawing Sheets

OPERATIONAL METHOD AND APPARATUS OVER GF($2^m$) USING A SUBFIELD GF($2^{m/2}$)

FIELD OF THE INVENTION

The present invention relates to an operation method and apparatus over Galois Field GF($2^m$), and more particularly relates to an operational method and apparatus over GF($2^m$) using a subfield GF($2^{m/2}$).

A finite field operation has recently been adapted to an error correcting code theory, a switching theory and a coding theory field etc., according to the improvement of digital signal processing. Specifically, in the case of implementing multipliers and dividers which are basic among the finite field, operation requires high speed operation and reduction in the complexity of a total system using the finite field operation by simplifying computation.

Generally, the representation method of respective elements over the finite field GF($2^m$) which have $2^m$ elements can be classified as a vector representation or an exponential representation.

In exponential representation operations, it's comparatively easy to multiply and divide but difficult to add. Accordingly, in implementing of hardware by exponential representation, the multiplier and the divider are comparatively simple but the adder is complex. And at the same time, in vector representation operations, it's easy to add but difficult to multiply and divide. Accordingly, in implementing of hardware by vector representation, an adder is simple while a multiplier and a divider are very complex.

For example, when implementing the multiplier of the finite field GF($2^8$), 64 AND gates and 73 XOR gates are needed, and an inversion circuit for the divider requires 304 AND gates and 494 OR gates.

SUMMARY OF THE INVENTION

Therefore, it is an object of the present invention to provide an operational method over GF($2^m$) using a subfield GF($2^{m/2}$) which can perform a high speed operation.

It is an another object of the present invention to provide an operational apparatus over GF($2^m$) using a subfield GF($2^{m/2}$) which can simplify a circuit construction.

To achieve the above objects, the operation method over GF($2^m$) using a subfield GF($2^{m/2}$) according to the present invention comprises steps of:

converting elements represented by a basis of GF($2^m$) into elements represented by a basis of subfield GF($2^{m/2}$);

performing an operation over subfield GF($2^{m/2}$) with respect to the elements represented by the basis of subfield GF($2^{m/2}$); and reverting the operated elements represented by the basis of subfield GF($2^{m/2}$) to the elements represented by the basis of GF($2^m$).

To achieve another object, the operation apparatus over GF($2^m$) using a subfield GF($2^{m/2}$) according to the present invention comprises:

a conversion means for converting the elements represented by a basis of GF($2^m$) into the elements represented by a basis of subfield GF($2^{m/2}$);

an operation means for performing an operation over subfield GF($2^{m/2}$) with respect to the elements represented by the basis of subfield GF($2^{m/2}$); and a reversion means for reverting the operated elements represented by the basis of subfield GF($2^{m/2}$) to the elements represented by the basis of GF($2^m$).

DETAILED DESCRIPTION OF THE INVENTION

The operational method and circuit over GF($2^8$) using a subfield GF($2^4$) as an embodiment of the present invention are as follows.

Suppose that $\alpha^4$ is an arbitrary element over GF($2^8$). It is represented as $\alpha^4 = a + b\beta$, where $a, b \in$ GF($2^4$) and $\beta \in$ GF($2^8$). If so, suppose that an arbitrary element over GF($2^8$) is·

$$\alpha^k = \sum_{i=0}^{7} z_i \lambda_i$$

where $\lambda_i$ is a basis.

It can also be represented as $$\alpha^k = z_0 + z_1\gamma + z_2\gamma^2 + z_3\gamma^3 + z_4\beta + z_5\beta\gamma + z_6\beta\gamma^2 + z_7\beta\gamma^3$$
$$= (z_0 + z_1\gamma + z_2\gamma^2 + z_3\gamma^3) + \beta(z_4 + z_5\gamma + z_6\gamma^2 + z_7\gamma^3)$$
$$= a + b\beta$$

where $\gamma \in$ GF($2^8$) and $\gamma \in$ GF($2^4$)

Here, $\{z_i\} = \{0, 1\}$ $\{\lambda_i\} = \{1, \gamma, \gamma^2, \gamma^3, \beta, \beta\gamma, \beta\gamma^2, \beta\gamma^3\}$ $\{\lambda_i\}$ is mutually linear independent.

In the present invention, a subfield GF($2^4$) of GF($2^8$) is used and a basis over a subfield GF($2^4$) of GF($2^8$) is defined as $\{1, \beta\}$, where $\beta \in$ GF($2^8$). Suppose that a root of a primitive polynomial P($\chi$) of GF($2^8$) is $\alpha$, where P($\chi$) = $\chi^8 + \chi^4 + \chi^3 + \chi^2 + 1$. The primitive polynomial is represented as $\alpha^8 + \alpha^4 + \alpha^3 + \alpha^2 + 1 = 0$. Suppose also that a root of a primitive polynomial P($\chi$) of GF($2^4$) is $\gamma$, where P($\chi$) = $\chi^4 + \chi^3 + 1$. This primitive polynomial is represented as $\gamma^4 + \gamma^3 + 1 = 0$. And the element $\gamma$ of GF($2^8$) to satisfy $\gamma^4 + \gamma^3 + 1 = 0$ is $\alpha^{119}$ and the element $\beta$ of GF($2^8$) to satisfy $\beta^2 = \alpha^{119} + 1$. $\beta$ is $\alpha^7$.

According to the above, the basis over GF($2^4$) of GF($2^8$) is $\{1, \gamma, \gamma^2, \gamma^3, \beta, \beta\gamma, \beta\gamma^2, \beta\gamma^3\} = \{1, \alpha^{119}, \alpha^{238}, \alpha^{102}, \alpha^7, \alpha^{126}, \alpha^{245}, \alpha^{109}\}$ And, an arbitrary element Z is represented by the above basis as follows.

$$Z = z_0 + z_1\alpha^{119} + z_2\alpha^{238} + z_3\alpha^{102} + z_4\alpha^7 + z_5\alpha^{126} + z_6\alpha^{245} + z_7\alpha^{109} \quad (1)$$
$$= (z_0 + z_1 + z_2 + z_6 + z_7) + (z_1 + z_2 + z_5)\alpha +$$
$$(z_3 + z_5 + z_7)\alpha^2 +$$
$$(z_2 + z_6 + z_7)\alpha^3 + (z_1 + z_7)\alpha^4 + (z_5 + z_6 + z_7)\alpha^5 +$$
$$(z_3 + z_5 + z_6)\alpha^6 + (z_1 + z_4 + z_6 + z_7)\alpha^7$$

i) From the equation (1), a conversion from elements represented by the basis of $GF(2^4)$ into elements represented by the basis of $GF(2^8)$ is as follows.

$$b_0 = z_0 + z_1 + z_2 + z_6 + z_7$$
$$b_1 = z_1 + z_2 + z_5$$
$$b_2 = z_3 + z_5 + z_7$$
$$b_3 = z_2 + z_6 + z_7$$
$$b_4 = z_1 + z_7$$
$$b_5 = z_5 + z_6 + z_7$$
$$b_6 = z_3 + z_5 + z_6$$
$$b_7 = z_1 + z_4 + z_6 + z_7 \quad (2)$$

Figure 1:
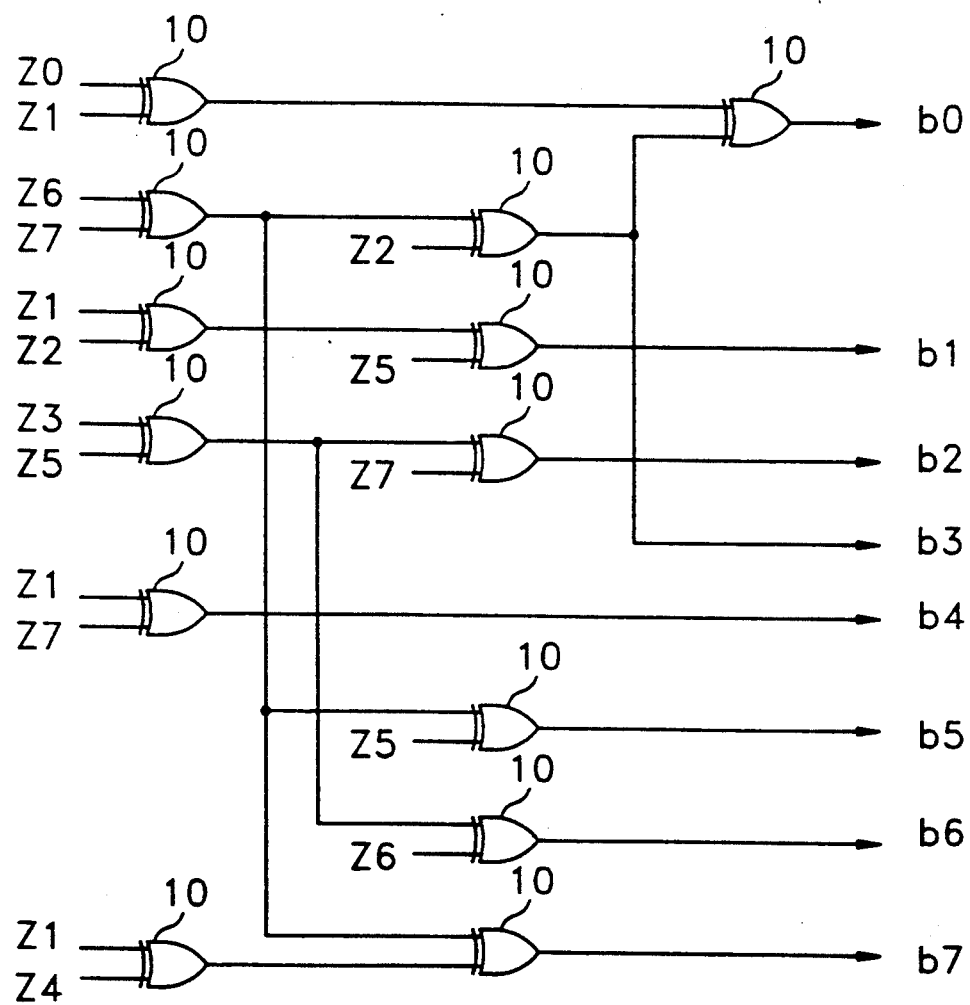
FIG. 1 is a logic circuit diagram of a conversion circuit for converting to the elements over GF($2^4$) according to the present invention.

FIG. 1 shows a logic circuit diagram for implementing the equation (2) by using thirteen XOR gates 10.

ii) From the equations (2), a conversion from elements represented by the basis of $GF(2^8)$ into elements represented by the basis of $GF(2^4)$ is as follows.

$$z_0 = b_0 + b_1 + b_5$$
$$z_1 = b_1 + b_3 + b_5$$
$$z_2 = b_2 + b_3 + b_6$$
$$z_3 = b_1 + b_3 + b_4 + b_6$$
$$z_4 = b_1 + b_2 + b_3 + b_5 + b_6 + b_7$$
$$z_5 = b_2 + b_5 + b_6$$
$$z_6 = b_1 + b_2 + b_3 + b_4 + b_5 + b_6$$
$$z_7 = b_1 + b_3 + b_4 + b_5 \quad (3)$$

Figure 2:
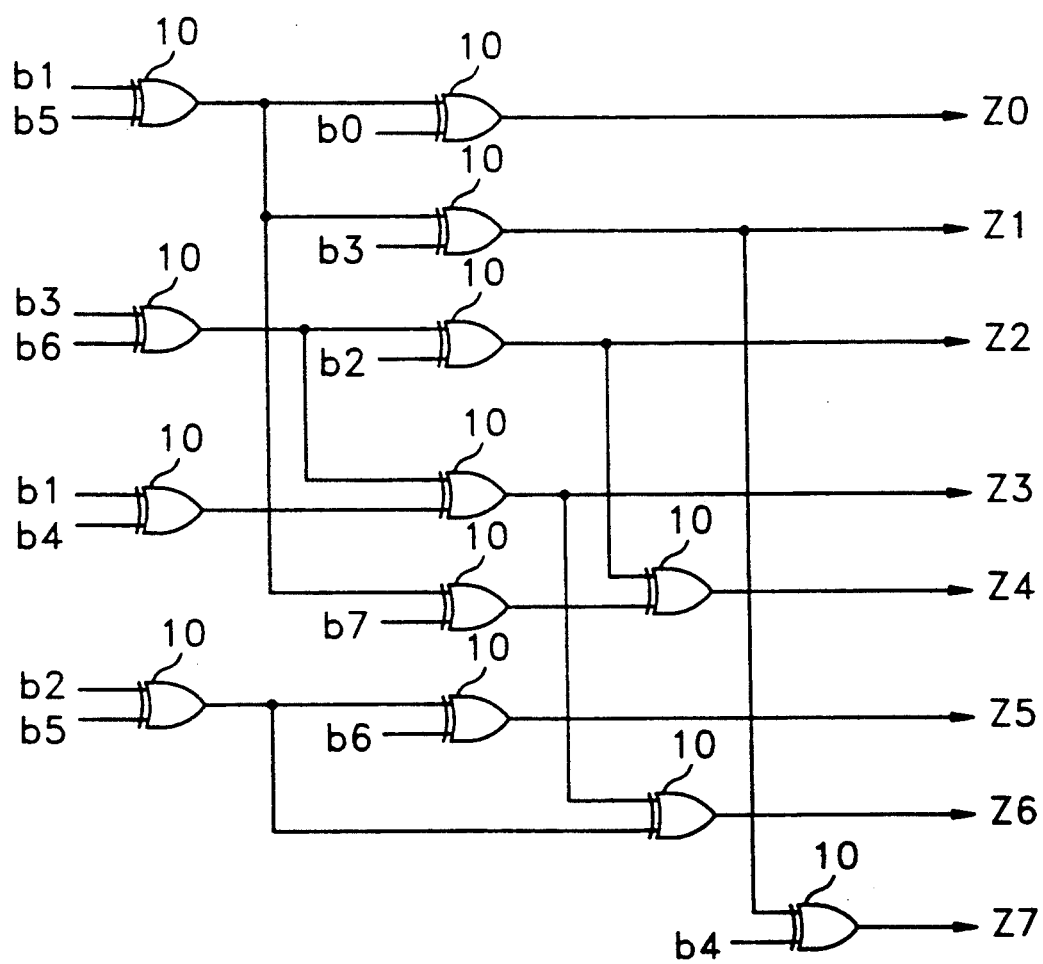
FIG. 2 is a logic circuit diagram of a reversion circuit for reverting to the elements over GF($2^8$) according to the present invention.

FIG. 2 shows a logic circuit diagram for implementing the equations (3) which uses thirteen XOR gates 10.

By using the conversion method and circuit and reversion method and circuit for respectively converting and reverting the elements represented by the basis of $GF(2^8)$ into the elements represented by the basis of $GF(2^4)$ from the equations (2) and (3), implementation of a multiplier, an inversion circuit, and a divider over $GF(2^4)$ are as follows.

Suppose that two elements A and B are the elements converted by the equations (2).

iii) Suppose that element C is the product of the elements A and B. This can be represented as:

$$C = A \cdot B$$
$$= (a_0 + a_1\beta) \cdot (b_0 + b_1\beta)$$
$$= c_0 + c_1\beta$$

where $a_0, a_1, b_0, b_1, c_0, c_1 \in GF(2^4)$.

Here, $c_0$ and $c_1$ are represented as:

$$c_0 = a_0b_0 + a_1b_1\gamma$$
$$c_1 = a_0b_1 + a_1b_0 + a_1b_1 \quad (4)$$

Figure 3:
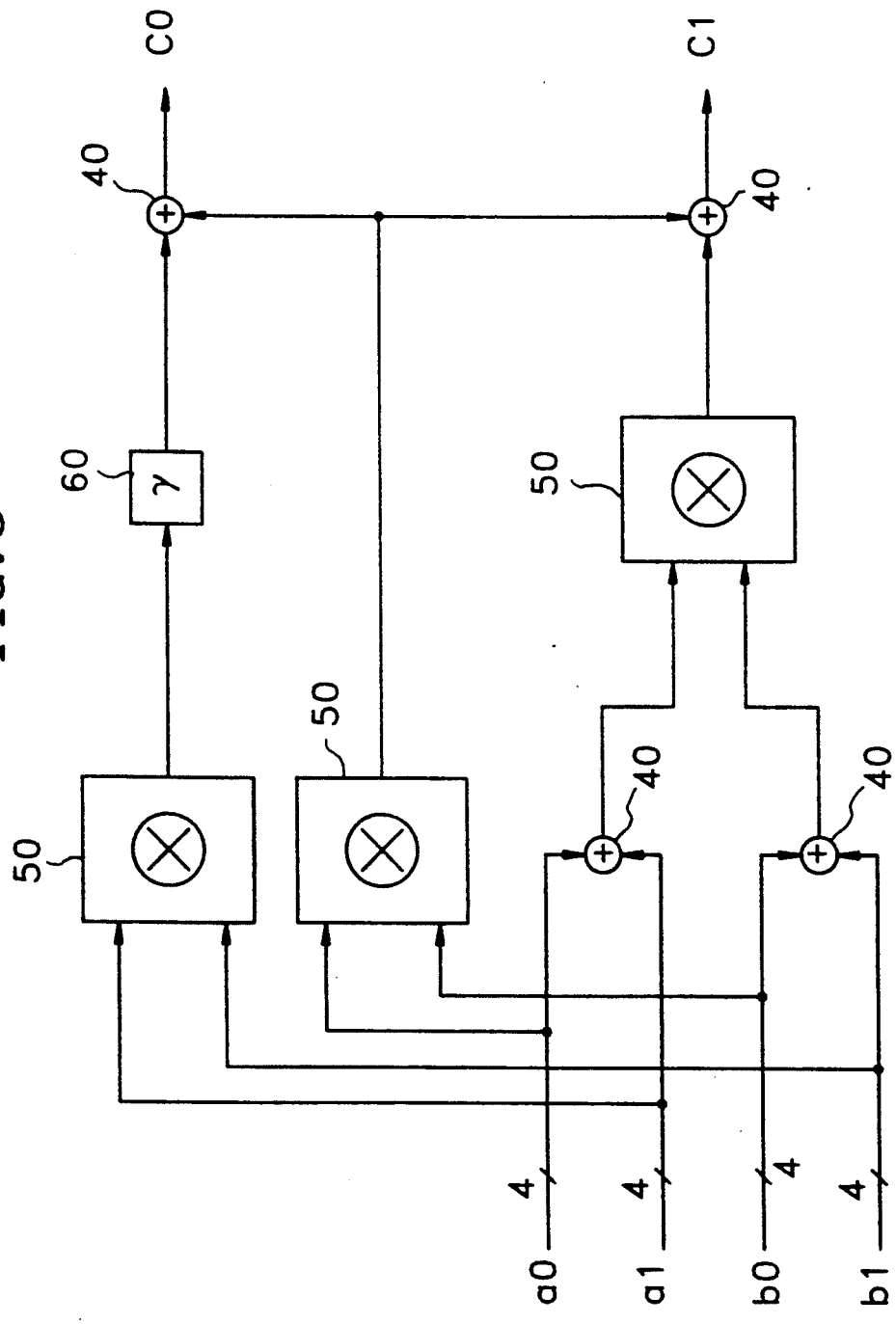
FIG. 3 is a block diagram of a multiplier using a subfield GF($2^4$) according to the present invention.

FIG. 3 shows a block diagram for implementing the equations (4) by using three multiplies over $GF(2^4)$ 50, four adders over $GF(2^4)$ 40, and a $\gamma$ multiplier over $GF(2^4)$ 60.

iv) Assuming that the inverse of Z is $Z^{-1}$, and $$Z = x_0 + x_1\beta$$

where $x_0, x_1 \in GF(2^4)$, and $$Z^{-1} = y_0 + y_1\beta$$

where $y_0, y_1 \in GF(2^4)$, then, $$Z \cdot Z^{-1} = (x_0 + x_1\beta)(y_0 + y_1\beta) \quad (5)$$
$$= x_0y_0 + x_0y_1\beta + y_0x_1\beta + x_1y_1\beta^2 = 1$$

where $\beta^2$ is represented by $f_0 + f_1\beta$, and $f_0, f_1 \in GF(2^4)$. In equation (5), if $\beta^2 = \gamma + \beta$ is taken to make f1 equal to 1, then following equation is derived from equation (5).

$$Z \cdot Z^{-1} = (x_0y_0 + x_1\gamma y_1) + (x_1y_0 + (x_0 + x_1)y_1)\beta = 1$$

and, $$\begin{bmatrix} x_0 & \gamma x_1 \\ x_1 & x_0 + x_1 \end{bmatrix} \cdot \begin{bmatrix} y_0 \\ y_1 \end{bmatrix} = \begin{bmatrix} 1 \\ 0 \end{bmatrix} \quad (6)$$

From the equation (6), the inverting results $y_0$ and $y_1$ are represented as:

$$y_0 = \frac{x_0 + x_1}{x_0(x_0 + x_1) + \gamma(x_1^2)} \quad (7)$$

$$y_1 = \frac{x_1}{x_0(x_0 + x_1) + \gamma(x_1^2)}$$

Figure 4:
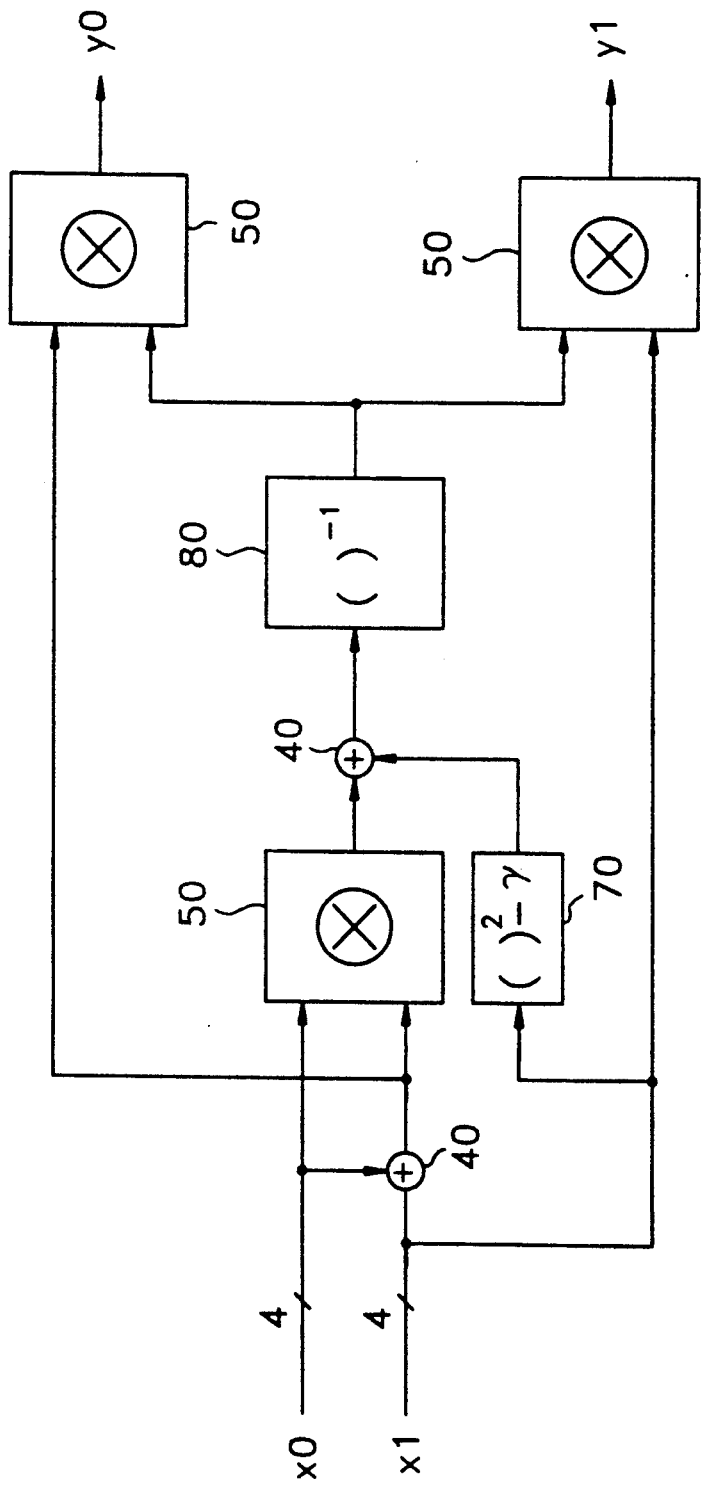
FIG. 4 is a block diagram of an inversion circuit using a subfield GF($2^4$) according to the present invention.

FIG. 4 shows a block diagram for implementing the equation (7) by using three multipliers over $GF(2^4)$ 50, an adder over $GF(2^4)$ 40, a square and $\gamma$ multiplier over $GF(2^4)$ 70, and an inversion circuit over $GF(2^4)$ 80.

v) Suppose that the quotient of elements A and B is D and let $$D = A/B$$
$$= (a_0 + a_1\beta)/(b_0 + b_1\beta)$$
$$= d_0 + d_1\beta,$$

where $a_0, a_1, b_0, b_1, d_0, d_1 \in GF(2^4)$.

Then, the quotient of $d_0$ and $d_1$ is represented as:

$$d_0 = \frac{a_0(b_0 + b_1) + a_1 b_1 \gamma}{b_0(b_0 + b_1) + \gamma(b_1^2)} \quad (8)$$

$$d_1 = \frac{a_1(b_0 + b_1) + b_1(a_0 + a_1)}{b_0(b_0 + b_1) + \gamma(b_1^2)}$$

Figure 5:
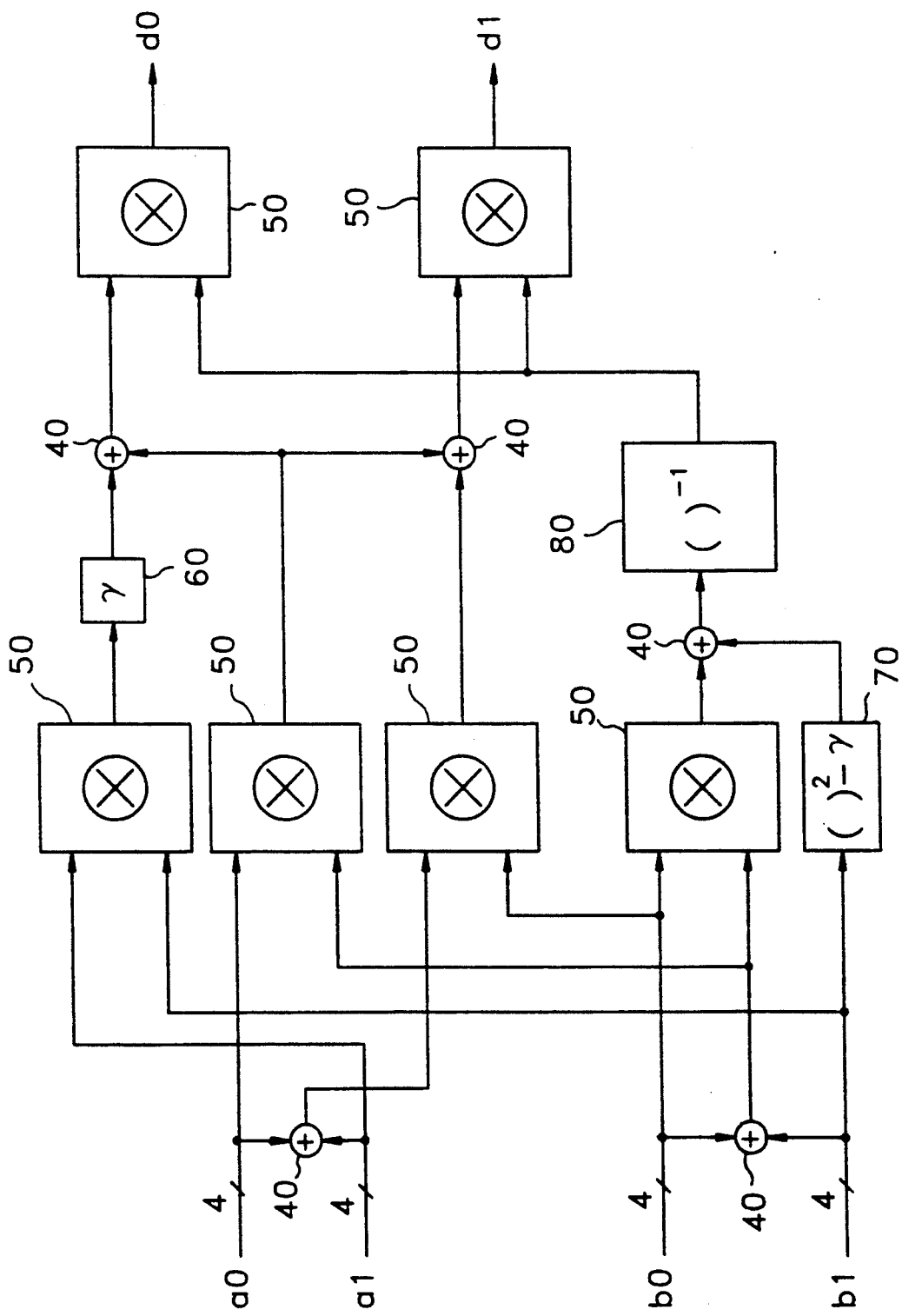
FIG. 5 is a block diagram of a divider using a subfield GF($2^4$) according to the present invention.

FIG. 5 shows a block diagram for implementing the equations (8) by using six multipliers over GF($2^4$) 50, five adders over GF($2^4$) 40, an inversion circuit over GF($2^4$) 80, a $\gamma$ multiplier 60, and a square and $\gamma$ multiplier over GF($2^4$) 70.

Steps for the implementation of a multiplier, an inversion circuit, a square and $\gamma$ multiplier, and $\gamma$ multiplier over GF($2^4$) which constitute the apparatuses shown in FIGS. 3, 4, 5 are as follows.

i) Suppose that the product of elements X and Y is Z and let $$\begin{aligned} Z &= X \cdot Y \quad (9) \\ &= (x_0 + x_1\alpha + x_2\alpha^2 + x_3\alpha^3) \cdot (y_0 + y_1\alpha + y_2\alpha^2 + y_3\alpha^3) \\ &= z_0 + z_1\alpha + z_2\alpha^2 + z_3\alpha^3, \end{aligned}$$

then $Z_0$, $Z_1$, $Z_2$ and $Z_3$ are represented as:

$$\begin{aligned} z_0 &= x_0 y_0 + x_3 y_1 + (x_2 + x_3) y_2 + (x_1 + x_2 + x_3) y_3 \\ z_1 &= x_1 y_0 + x_0 y_1 + x_3 y_2 + (x_2 + x_3) y_3 \\ z_2 &= x_2 y_0 + x_1 y_1 + x_0 y_2 + x_3 y_3 \\ z_3 &= x_3 y_0 + (x_2 + x_3) y_1 + (x_1 + x_2 + x_3) y_2 + \\ &\quad (x_0 + x_1 + x_2 + x_3) y_3 \end{aligned}$$

Figure 6:
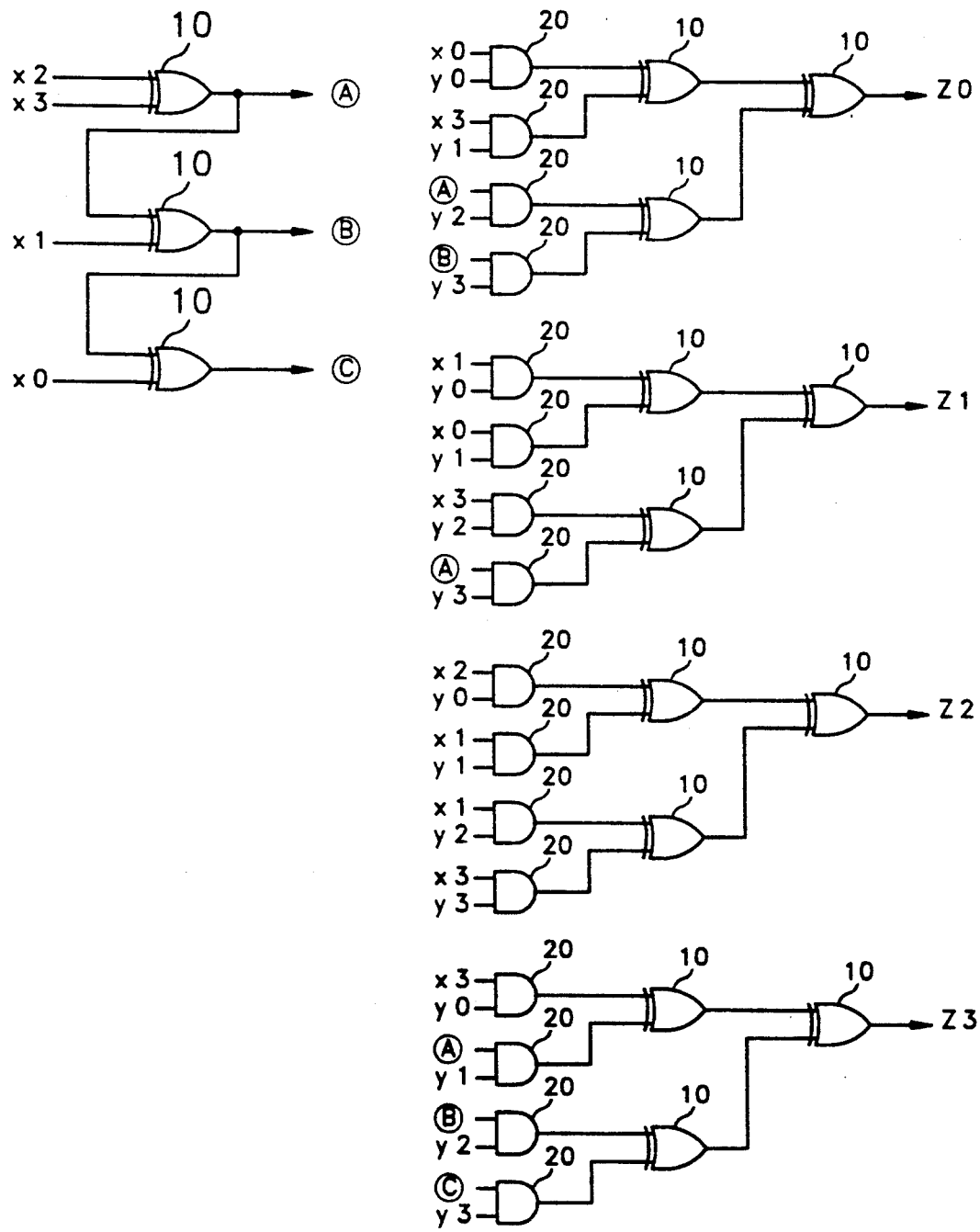
FIG. 6 is a logic circuit diagram of a multiplier over GF($2^4$) according to the present invention.

FIG. 6 shows a logic circuit diagram for implementing the equations (9) by using sixteen AND gates 20 and fifteen XOR gates 10.

ii) Suppose that the inverse of element A is I, the inversion table is as follows.

| | $a_0$ | $a_1$ | $a_2$ | $a_3$ | $I_0$ | $I_1$ | $I_2$ | $I_3$ |
|---|---|---|---|---|---|---|---|---|
| 1 | 1 | 0 | 0 | 0 | 1 | 0 | 0 | 0 |
| $\gamma$ | 0 | 1 | 0 | 0 | 0 | 0 | 1 | 1 |
| $\gamma^2$ | 0 | 0 | 1 | 0 | 0 | 1 | 1 | 0 |
| $\gamma^3$ | 0 | 0 | 0 | 1 | 1 | 1 | 0 | 0 |
| $\gamma^4$ | 1 | 0 | 0 | 1 | 1 | 0 | 1 | 1 |
| $\gamma^5$ | 1 | 1 | 0 | 1 | 0 | 1 | 0 | 1 |
| $\gamma^6$ | 1 | 1 | 1 | 1 | 0 | 1 | 1 | 0 |
| $\gamma^7$ | 1 | 1 | 1 | 0 | 0 | 1 | 1 | 1 |
| $\gamma^8$ | 0 | 1 | 1 | 1 | 1 | 1 | 1 | 0 |
| $\gamma^9$ | 1 | 0 | 1 | 0 | 1 | 1 | 1 | 1 |
| $\gamma^{10}$ | 0 | 1 | 0 | 1 | 1 | 1 | 0 | 1 |
| $\gamma^{11}$ | 1 | 0 | 1 | 1 | 1 | 0 | 0 | 1 |
| $\gamma^{12}$ | 1 | 1 | 0 | 0 | 0 | 0 | 0 | 1 |
| $\gamma^{13}$ | 0 | 1 | 1 | 0 | 0 | 0 | 1 | 0 |
| $\gamma^{14}$ | 0 | 0 | 1 | 1 | 0 | 1 | 0 | 0 |

The above table is simplified by a Karnaugh's map as follows:

$$I_0 = a_0 a_1 + a_0 a_2 a_3 + a_1 a_2 a_3$$

$$I_1 = a_0 a_3 + a_1 a_2 a_3 + a_0 a_1 a_2 + a_0 a_2 a_3$$

$$I_2 = a_1 a_2 + a_2 a_3 + a_0 a_1 a_3 + a_0 a_1 a_2 a_3$$

$$I_3 = a_1 a_2 + a_0 a_1 a_3 + a_0 a_2 a_3 \quad (10)$$

Figure 7:
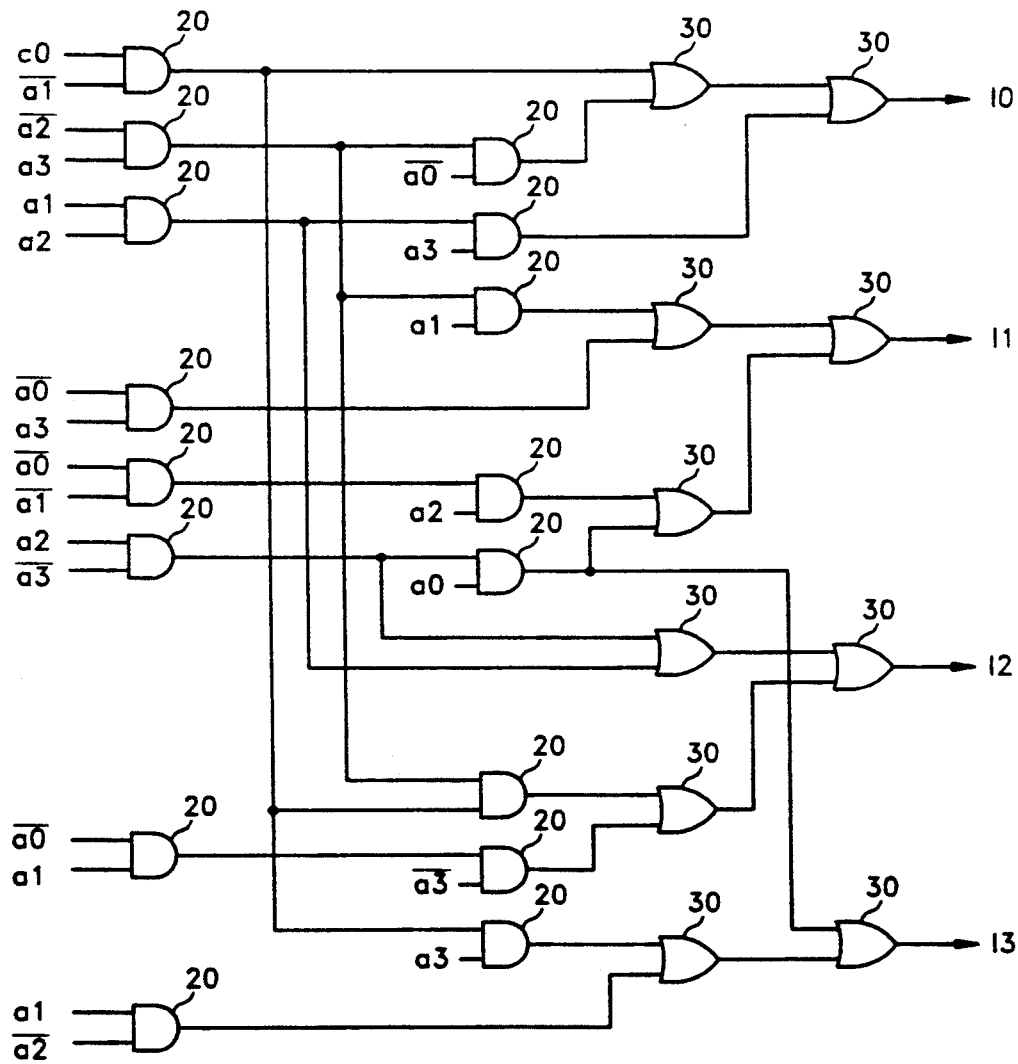
FIG. 7 is a logic circuit diagram of an inversion circuit over GF($2^4$) according to the present invention.
Figure 8:
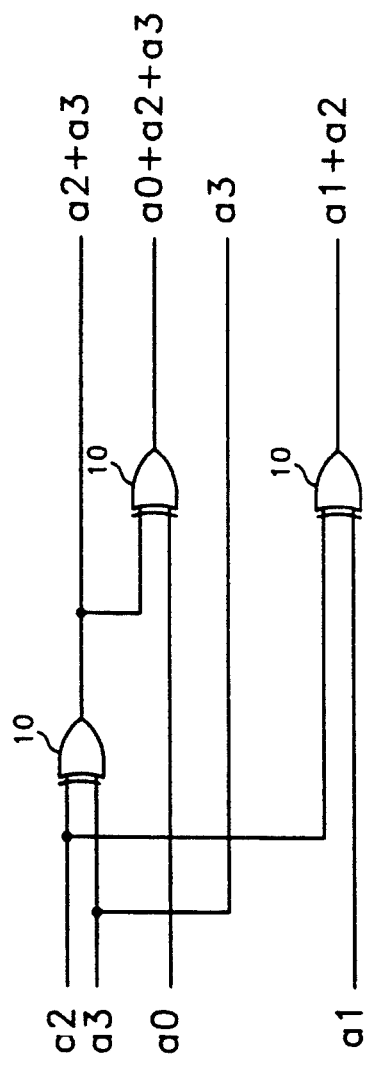
FIG. 8 is a logic circuit diagram of a square and $\gamma$ multiplier over GF($2^4$) according to the present invention.

FIG. 7 shows a logic circuit diagram for implementing the equation (10) by using sixteen AND gates 20, ten OR gates 30, and four inverters which are unshown and corresponding to $a_0$ through $a_3$.

iii) To implement the square and $\gamma$ multiplier, suppose that element A is $a_0 + a_1\gamma + a_2\gamma^2 + a_3\gamma^3$, where $\gamma^4 = \gamma^3 + 1$. Then, $\gamma A^2$ is represented by $(a_2 + a_3) + (a_0 + a_2 + a_3)\gamma + a_3\gamma^2 + (a_1 + a_2)$. FIG. 8 shows a logic circuit diagram for implementing the equation by using three XOR gates 10.

iv) To implement the $\gamma$ multiplier, suppose that element A is $a_0 + a_1\gamma + a_2\gamma^2 + a_3\gamma^3$, where $\gamma^4 = \gamma^3 + 1$. Then, $\gamma A$ is represented by $a_3 + a_0\gamma + a_1\gamma^2 + (a_2 + a_3)\gamma^3$.

Figure 9:
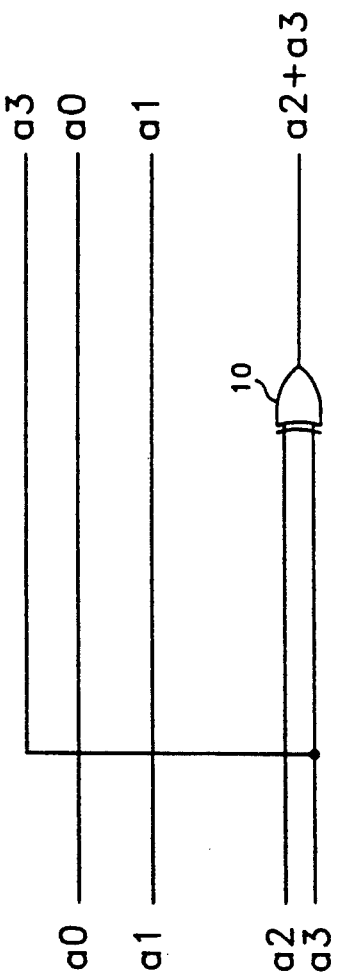
FIG. 9 is a logic circuit diagram of a $\gamma$ multiplier over GF($2^4$) according to the present invention.

FIG. 9 shows a logic circuit diagram for implementing the equation by using one XOR gate 10.

Here, the total numbers of gates used in the multiplier, the divider, and the inversion circuit will be calculated. The multiplier, the divider, and the inversion circuit over GF($2^8$) using the subfield GF($2^4$) must have the circuits of FIGS. 1 and 2 basically.

In FIG. 3, the total number of gates breaks down as follows.

| | AND gate | XOR gate |
|---|---|---|
| GF($2^8$) →GF($2^4$) | | 13 |
| three multipliers | 16 × 3 = 48 | 16 × 3 = 45 |
| $\gamma$ multiplier | | 1 |
| four adders | | 4 × 4 = 16 |
| GF($2^4$) →GF($2^8$) | | 13 |
| | 48 | 88 |

In FIG. 4, the total number of gates breaks down as follows.

| | AND gate | XOR gate | OR gate | NOT gate |
|---|---|---|---|---|
| GF($2^8$) →GF($2^4$) | | 13 | | |
| three multipliers | 16 × 3 = 48 | 15 × 3 = 45 | | |
| inversion circuit | | | 10 | 4 |
| a square and $\gamma$ multiplier | | 3 | | |
| two adders | | 4 × 2 = 8 | | |
| GF($2^4$) →GF($2^8$) | | 13 | | |
| | 64 | 82 | 10 | 4 |

In FIG. 5, the total number of gates breaks down as follows.

| | AND gate | XOR gate | OR gate | NOT gate |
|---|---|---|---|---|
| GF($2^8$) →GF($2^4$) | | 13 | | |
| six multipliers | 16 × 6 = 96 | 15 × 6 = 90 | | |
| five adders | | 4 × 5 = 20 | | |
| $\gamma$ multiplier | | 1 | | |
| inversion circuit | 16 | | 10 | 4 |
| a square and $\gamma$ multiplier | | 3 | | |
| GF($2^4$) →GF($2^8$) | | 13 | | |

-continued

| AND gate | XOR gate | OR gate | NOT gate |
|---|---|---|---|
| 112 | 140 | 10 | 4 |

Accordingly, with the implementation of the multiplier, the divider, and the inversion circuit over $GF(2^8)$ by using the subfield $GF(2^4)$, the present invention simplifies the circuit and performs high speed operation by decreasing the number of logic gates. The circuit of the present invention can be applied to the multiplier, the divider, and the inversion circuit, over $GF(2^m)$ where m is more than 8 or less. Also, the conversion and reversion process of the elements over $GF(2^m)$ can be more than once.

Although the present invention has been described and illustrated in detail, it is clearly understood that the same is for illustration and example only and is not to be taken as a limitation, the spirit and scope of the present invention being limited only by the terms of the appended claims.

What is claimed is:

1. An operational apparatus over Galois Field $GF(2^8)$ using subfield Galois Field $GF(2^4)$ in which a primitive polynomial equation of $GF(2^8)$ is $P(x) = x^8 + x^4 + x^3 + x^2 + 1$ and a primitive polynomial equation of $GF(2^4)$ is $P(x) = x^4 + x^3 + 1$ comprising: converting means satisfying the equations $$z_0 = b_0 + b_1 + b_5$$

$$z_1 = b_1 + b_3 + b_5$$

$$z_2 = b_2 + b_3 + b_6$$

$$z_3 = b_1 + b_3 + b_4 + b_6$$

$$z_4 = b_1 + b_2 + b_3 + b_5 + b_6 + b_7$$

$$z_5 = b_2 + b_5 + b_6$$

$$z_6 = b_1 + b_2 + b_3 + b_4 + b_5 + b_6$$

$$z_7 = b_1 + b_3 + b_4 + b_5$$

for converting elements $b_0$, $b_1$, $b_2$, $b_3$, $b_4$, $b_5$, $b_6$, and $b_7$ represented by a basis over $GF(2^8)$ and representing digital information, into elements $z_0$, $z_1$, $z_2$, $z_3$, $z_4$, $z_5$, $z_6$, and $z_7$ represented by a basis over $GF(2^4)$;

operational means for receiving said elements $z_0$, $z_1$, $z_2$, $z_3$, $z_4$, $z_5$, $z_6$, and $z_7$ of said converting means and performing a mathematical operation in $GF(2^4)$ on said elements $z_0$, $z_1$, $z_2$, $z_3$, $z_4$, $z_5$, $z_6$, and $z_7$; and reversion means satisfying the equations $$b_0 = z_0 + z_1 + z_2 + z_6 + z_7$$

$$b_1 = z_1 + z_2 + z_5$$

$$b_2 = z_3 + z_5 + z_7$$

$$b_3 = z_2 + z_6 + z_7$$

$$b_4 = z_1 + z_7$$

$$b_5 = z_5 + z_6 + z_7$$

$$b_6 = z_3 + z_5 + z_6$$

$$b_7 = z_1 + z_4 + z_6 + z_7$$

for reverting said operated elements $z_0$, $z_1$, $z_2$, $z_3$, $z_4$, $z_5$, $z_6$, and $z_7$ represented by a basis over $GF(2^4)$ into operated elements $b_0$, $b_1$, $b_2$, $b_3$, $b_4$, $b_5$, $b_6$, and $b_7$ represented by a basis over $GF(2^8)$;

wherein said operational means comprises:

a first multiplier over $GF(2^4)$ for receiving and producing the product of a higher-order 4-bit signal of numbers A and B through said converting means;

a second multiplier over $GF(2^4)$ for receiving and producing the product of a lower-order 4-bit signal of numbers A and B through said converting means;

a first adder over $GF(2^4)$ for receiving and adding said higher-order 4-bit signal and lower-order 4-bit signal of said number A;

a second adder over $GF(2^4)$ for receiving and adding said higher-order 4-bit signal and lower-order 4-bit signal of said number B;

a coefficient multiplier for producing a product of the output signals of said first multiplier over $GF(2^4)$ and a predetermined coefficient;

a third adder over $GF(2^4)$ for adding the output signals of said coefficient multiplier and said second multiplier over $GF(2^4)$;

a third multiplier over $GF(2^4)$ for adding the output signals of said first and second adder over $GF(2^4)$; and a fourth adder over $GF(2^4)$ for adding the output signals of said second and third multipliers over $GF(2^4)$.

2. An operational apparatus over $GF(2^4)$ using $GF(2^4)$ as claimed in claim 1, wherein said multiplier over $GF(2^4)$ satisfying the equations $$z_0 = x_0 y_0 + x_3 y_1 + (x_2 + x_3) y_2 + (x_1 + x_2 + x_3) y_3$$

$$z_1 = x_1 y_0 + x_0 y_1 + x_3 y_2 + (x_2 + x_3) y_3$$

$$z_2 = x_2 y_0 + x_1 y_1 + x_0 y_2 + x_3 y_3$$

$$z_3 = x_3 y_0 + (x_2 + y_3) y_1 + (x_1 + x_2 + x_3) y_2 + (x_0 + x_1 + x_3) y_3$$

for performing the operation of $z = xy$.

3. An operational apparatus over $GF(2^8)$ using $GF(2^4)$ as claimed in claim 1, wherein said inversion circuit over $GF(2^4)$ satisfying the equations $$I_0 = a_0 a_1 + a_0 a_2 a_3 + a_1 a_2 a_3$$

$$I_1 = a_0 a_3 + a_1 a_2 a_3 + a_0 a_1 a_2 + a_0 a_2 a_3$$

$$I_2 = a_1 a_2 + a_2 a_3 + a_0 a_1 a_3 + a_0 a_1 a_2 a_3$$

$$I_3 = a_1 a_2 + a_0 a_1 a_3 + a_0 a_2 a_3$$

for performing the operation $I = 1/A$, wherein $a_0$, $a_1$, $a_2$, $a_3$ are elements of A.

4. An operation apparatus over $GF(2^8)$ using $GF(2^4)$ as claimed in claim 1, wherein said square and coefficient multiplier over $GF(2^4)$ satisfying the equations $$c_0 = a_2 + a_3$$

$$c_1 = a_0 + a_2 + a_3$$

$c_0 = a_3$ $c_3 = a_1 + a_2$ for performing the operation for obtaining a result C by multiplying $A^2$ by said coefficient wherein $a_0, a_1, a_2, a_3$ are elements of A; and wherein $c_0, c_1$ and $c_3$ are elements of C.

5. An operation apparatus of $GF(2^8)$ using $GF(2^4)$ as claimed in claim 1, wherein said coefficient multiplier over $GF(2^4)$ satisfying the equations $d_0 = a_3$ $d_1 = a_0$ $d_2 = a_1$ $d_3 = a_2 + a_3$ to obtain a result D, wherein $a_0, a_1, a_2, a_3$ are elements of A, and wherein $d_0, d_1, d_2, d_3$ are elements of D.

6. An operational apparatus over Galois Field $GF(2^8)$ using subfield Galois Field $GF(2^4)$ in which a primitive polynomial equation of $GF(2^8)$ is $P(x) = x^8 + x^4 + x^3 + x^2 + 1$ and a primitive polynomial equation of $GF(2^4)$ is $P(x) = x^4 + x^3 + 1$ comprising: converting means satisfying the equations $z_0 = b_0 + b_1 + b_5$ $z_1 = b_1 + b_3 + b_5$ $z_2 = b_2 + b_3 + b_6$ $z_3 = b_1 + b_3 + b_4 + b_6$ $z_4 = b_1 + b_2 + b_3 + b_5 + b_6 + b_7$ $z_5 = b_2 + b_5 + b_6$ $z_6 = b_1 + b_2 + b_3 + b_4 + b_5 + b_6$ $z_7 = b_1 + b_3 + b_4 + b_5$ for converting elements $b_0, b_1, b_2, b_3, b_4, b_5, b_6,$ and $b_7$ represented by a basis over $GF(2^8)$ and representing digital information, into elements $z_0, z_1, z_2, z_3, z_4, z_5, z_6,$ and $z_7$ represented by a basis over $GF(2^4)$;
operational means for receiving said elements $z_0, z_1, z_2, z_3, z_4, z_5, z_6,$ and $z_7$ of said converting means and performing a mathematical operation in $GF(2^4)$ on said elements $z_0, z_1, z_2, z_3, z_4, z_5, z_6,$ and $z_7$; and reversion means satisfying the equations $b_0 = z_0 + z_1 + z_2 + z_6 + z_7$ $b_1 = z_1 + z_2 + z_5$ $b_2 = z_3 + z_5 + z_7$ $b_3 = z_2 + z_6 + z_7$ $b_4 = z_1 + z_7$ $b_5 = z_5 + z_6 + z_7$ $b_6 = z_3 + z_5 + z_6$ $b_7 = z_1 + z_4 + z_6 + z_7$ for reverting said operated elements $z_0, z_1, z_2, z_3, z_4, z_5, z_6,$ and $z_7$ represented by a basis over $GF(2^4)$ into operated elements $b_0, b_1, b_2, b_3, b_4, b_5, b_6,$ and $b_7$ represented by a basis over $GF(2^8)$;
wherein said operational means comprises:
a first adder over $GF(2^4)$ for adding a higher-order 4-bit signal and a lower-order 4-bit signal of a number A through said converting means;
a first multiplier over $GF(2^4)$ for producing the product of said lower-order 4-bit signal of number A and the output signal of said first adder over $GF(2^4)$;
a square and coefficient multiplier for squaring and producing the product of the coefficients of said higher-order 4-bit signal of said number A;
a second adder over $GF(2^4)$ for adding the output signals of said first multiplier over $GF(2^4)$ and said square and coefficient multiplier;
an inversion circuit over $GF(2^4)$ for inverting the output signal of said second adder over $GF(2^4)$;
a second multiplier over $GF(2^4)$ for producing the product of said higher-order 4-bit signal of said number A and the output signal of said inversion circuit over $GF(2^4)$; and
a third multiplier over $GF(2^4)$ for producing the product of said lower-order 4-bit signal of said number A and the output signal of said inversion circuit over $GF(2^4)$.

7. An operational apparatus over $GF(2^4)$ using $GF(2^4)$ as claimed in claim 6, wherein said multiplier over $GF(2^4)$ satisfying the equations $z_0 = x_0 y_0 + x_3 y_1 + (x_2 + x_3) y_2 + (x_1 + x_2 + x_3) y_3$ $z_1 = x_1 y_0 + x_0 y_1 + x_3 y_2 + (x_2 + x_3) y_3$ $z_2 = x_2 y_0 + x_1 y_1 + x_0 y_2 + x_3 y_3$ $z_3 = x_3 y_0 + (x_2 + y_3) y_1 + (x_1 + x_2 + x_3) y_2 + (x_0 + x_1 + x_3) y_3$ for performing the operation of $z = xy$.

8. An operational apparatus over $GF(2^8)$ using $GF(2^4)$ as claimed in claim 6, wherein said inversion circuit over $GF(2^4)$ satisfying the equations $I_0 = a_0 a_1 + a_0 a_2 a_3 + a_1 a_2 a_3$ $I_1 = a_0 a_3 + a_1 a_2 a_3 + a_0 a_1 a_2 + a_0 a_2 a_3$ $I_2 = a_1 a_2 + a_2 a_3 + a_0 a_1 a_3 + a_0 a_1 a_2 a_3$ $I_3 = a_1 a_2 + a_0 a_1 a_3 + a_0 a_2 a_3$ for performing the operation $I = 1/A$, wherein $a_0, a_1, a_2, a_3$ are elements of A.

9. An operation apparatus over $GF(2^8)$ using $GF(2^4)$ as claimed in claim 6, wherein said square and coefficient multiplier over $GF(2^4)$ satisfying the equations $c_0 = a_2 + a_3$ $c_1 = a_0 + a_2 + a_3$ $c_0 = a_3$ $c_3 = a_1 + a_2$ for performing the operation for obtaining a result C by multiplying $A^2$ by said coefficient wherein $a_0$, $a_1$, $a_2$, $a_3$ are elements of A; and wherein $c_0$, $c_1$ and $c_3$ are elements of C.

10. An operation apparatus of $GF(2^8)$ using $GF(2^4)$ as claimed in claim 6, wherein said coefficient multiplier over $GF(2^4)$ satisfying the equations $$d_0 = a_3$$
$$d_1 = a_0$$
$$d_2 = a_1$$
$$d_3 = a_2 + a_3$$

to obtain a result D, wherein $a_0$, $a_1$, $a_2$, $a_3$ are elements of A, and wherein $d_0$, $d_1$, $d_2$, $d_3$ are elements of D.

11. An operational apparatus over Galois Field $GF(2^8)$ using subfield Galois Field $GF(2^4)$ in which a primitive polynomial equation of $GF(2^8)$ is $P(x) = x^8 + x^4 + x^3 + x^2 + 1$ and a primitive polynomial equation of $GF(2^4)$ is $P(x) = x^4 + x^3 + 1$ comprising:

converting means satisfying the equations $$z_0 = b_0 + b_1 + b_5$$
$$z_1 = b_1 + b_3 + b_5$$
$$z_2 = b_2 + b_3 + b_6$$
$$z_3 = b_1 + b_3 + b_4 + b_6$$
$$z_4 = b_1 + b_2 + b_3 + b_5 + b_6 + b_7$$
$$z_5 = b_2 + b_5 + b_6$$
$$z_6 = b_1 + b_2 + b_3 + b_4 + b_5 + b_6$$
$$z_7 = b_1 + b_3 + b_4 + b_5$$

for converting elements $b_0$, $b_1$, $b_2$, $b_3$, $b_4$, $b_5$, $b_6$, and $b_7$ represented by a basis over $GF(2^8)$ and representing digital information, into elements $z_0$, $z_1$, $z_2$, $z_3$, $z_4$, $z_5$, $z_6$, and $z_7$ represented by a basis over $GF(2^4)$;

operational means for receiving said elements $z_0$, $z_1$, $z_2$, $z_3$, $z_4$, $z_5$, $z_6$, and $z_7$ of said converting means and performing a mathematical operation in $GF(2^4)$ on said elements $z_0$, $z_1$, $z_2$, $z_3$, $z_4$, $z_5$, $z_6$, and $z_7$; and reversion means satisfying the equations $$b_0 = z_0 + z_1 + z_2 + z_6 + z_7$$
$$b_1 = z_1 + z_2 + z_5$$
$$b_2 = z_3 + z_5 + z_7$$
$$b_3 = z_2 + z_6 + z_7$$
$$b_4 = z_1 + z_7$$
$$b_5 = z_5 + z_6 + z_7$$
$$b_6 = z_3 + z_5 + z_6$$
$$b_7 = z_1 + z_4 + z_6 + z_7$$

for reverting said operated elements $z_0$, $z_1$, $z_2$, $z_3$, $z_4$, $z_5$, $z_6$, and $z_7$ represented by a basis over $GF(2^4)$ into operated elements $b_0$, $b_1$, $b_2$, $b_3$, $b_4$, $b_5$, $b_6$, and $b_7$ represented by a basis over $GF(2^8)$;

said operational means for performing the operation of B/A, where A and B are numbers in $GF(2^8)$, comprising:

a first adder over $GF(2^4)$ for adding a higher-order 4-bit signal and a lower-order 4-bit signal of said number A;

a second adder over $GF(2^4)$ for adding a higher-order 4-bit signal and a lower-order 4-bit signal of said number B;

a first multiplier over $GF(2^4)$ for producing the product of said higher-order 4-bit signal of said number A and said lower-order 4-bit signal of said number B;

a second multiplier over $GF(2^4)$ for producing the product of said higher-order 4-bit signal of said number A and said lower-order 4-bit signal of said number B;

a third multiplier over $GF(2^4)$ for producing the product of the output signal of said first adder over $GF(2^4)$ and said lower-order 4-bit signal of said number B;

a fourth multiplier over $GF(2^4)$ for producing the product of said lower-order 4-bit signal and the output signal of said fourth multiplier over $GF(2^4)$;

a square and coefficient multiplier for squaring and producing a product of the coefficients of said lower-order 4-bit signal of said number B;

a third adder over $GF(2^4)$ for adding the output signals of said fourth multiplier over $GF(2^4)$ and said square and coefficient multiplier;

a coefficient multiplier for producing a product of the output signals of said first multiplier over $GF(2^4)$ and a predetermined coefficient;

a fourth adder over $GF(2^4)$ for adding the output signals of said coefficient multiplier and second adder over $GF(2^4)$;

a fifth adder over $GF(2^4)$ for adding the output signals of said second and third multipliers over $GF(2^4)$;

an inversion circuit for inverting the output signal of said third adder over $GF(2^4)$;

a fifth multiplier over $GF(2^4)$ for producing the product of the output signals of said fourth adder and said inversion circuit over $GF(2^4)$; and a sixth multiplier over $GF(2^4)$ for producing the product of the output signals of said fifth adder over $GF(2^4)$ and said inversion circuit.

12. An operational apparatus over $GF(2^4)$ using $GF(2^4)$ as claimed in claim 11, wherein said multiplier over $GF(2^4)$ satisfying the equations $$z_0 = x_0 y_0 + x_3 y_1 + (x_2 + x_3) y_2 + (x_1 + x_2 + x_3) y_3$$
$$z_1 = x_1 y_0 + x_0 y_1 + x_3 y_2 + (x_2 + x_3) y_3$$
$$z_2 = x_2 y_0 + x_1 y_1 + x_0 y_2 + x_3 y_3$$
$$z_3 = x_3 y_0 + (x_2 + y_3) y_1 + (x_1 + x_2 + x_3) y_2 + (x_0 + x_1 + x_3) y_3$$

for performing the operation of $z = xy$.

13. An operational apparatus over $GF(2^8)$ using $GF(2^4)$ as claimed in claim 11, wherein said inversion circuit over $GF(2^4)$ satisfying the equations $$I_0 = a_0 a_1 + a_0 a_2 a_3 + a_1 a_2 a_3$$

$$I_1 = a_0a_3 + a_1a_2a_3 + a_0a_1a_2 + a_0a_2a_3$$

$$I_2 = a_1a_2 + a_2a_3 + a_0a_1a_3 + a_0a_1a_2a_3$$

$$I_3 = a_1a_2 + a_0a_1a_3 + a_0a_0a_2a_3$$

for performing the operation $I = 1/A$, wherein $a_0, a_1, a_2, a_3$ are elements of A.

14. An operation apparatus over $GF(2^8)$ using $GF(2^4)$ as claimed in claim 11, wherein said square and coefficient multiplier over $GF(2^4)$ satisfying the equations $$c_0 = a_2 + a_3$$

$$c_1 = a_0 + a_2 + a_3$$

$$c_0 = a_3$$

$$c_3 = a_1 + a_2$$

for performing the operation for obtaining a result C by multiplying $A^2$ by said coefficient wherein $a_0, a_1, a_2, a_3$ are elements of A; and wherein $c_0, c_1$ and $c_3$ are elements of C.

15. An operation apparatus of $GF(2^8)$ using $GF(2^4)$ as claimed in claim 11, wherein said coefficient multiplier over $GF(2^4)$ satisfying the equations $$d_0 = a_3$$

$$d_1 = a_0$$

$$d_2 = a_1$$

$$d_3 = a_2 + a_3$$

to obtain a result D, wherein $a_0, a_1, a_2, a_3$ are elements of A, and wherein $d_0, d_1, d_2, d_3$ are elements of D.

* * * * *

UNITED STATES PATENT AND TRADEMARK OFFICE
CERTIFICATE OF CORRECTION

PATENT NO. : 5,227,992

DATED : July 13, 1993

INVENTOR(S) : Man-young Lee et al.

page 1 of 2

It is certified that error appears in the above-identified patent and that said Letters Patent is hereby corrected as shown below:

On the Title page, item [56], References Cited, line 1, "4,162,480  7/1974" should be changed to
--4,162,480  7/1979--.

Col. 2, line 34, change "$\epsilon$" to --$\in$--.

Col. 2, line 35, change "$\epsilon$" to --$\in$--.

Col. 2, line 50, change "$\epsilon$" to --$\in$-- (both occurrences).

Col. 2, line 52, after "$\beta\gamma^3\}$" start a new line.

Col. 2, line 56, change "$\epsilon$" to --$\in$--.

Col. 4, line 7, change "$\epsilon$" to --$\in$--.

Col. 4, line 15, change "multiplies" to --multipliers--.

Col. 4, line 22, change "$\epsilon$" to --$\in$--.

Col. 4, line 26, change "$\epsilon$" to --$\in$--.

Col. 4, line 32, change "$\epsilon$" to --$\in$--.

Col. 5, line 62, change "$a_0 a_1 + a_0 a_2 a_3 + a_1 a_2 a_3$" to --$a_0 \bar{a}_1 + \bar{a}_0 \bar{a}_2 a_3 + a_1 a_2 a_3$--.

Col. 5, line 64, change "$a_0 a_3 + a_1 a_2 a_3 + a_0 a_1 a_2 + a_0 a_2 a_3$" to --$\bar{a}_0 a_3 + a_1 \bar{a}_2 a_3 + \bar{a}_0 \bar{a}_1 a_2 + a_0 a_2 \bar{a}_3$--.

UNITED STATES PATENT AND TRADEMARK OFFICE
CERTIFICATE OF CORRECTION

PATENT NO. : 5,227,992
DATED : July 13, 1993
INVENTOR(S) : Man-young Lee et al.

It is certified that error appears in the above-identified patent and that said Letters Patent is hereby corrected as shown below:

Col. 5, line 66, change "$a_1a_2 + a_2a_3 + a_0a_1a_3 + a_0a_1a_2a_3$" to --$a_1a_2 + a_2\bar{a}_3 + \bar{a}_0a_1\bar{a}_3 + a_0\bar{a}_1\bar{a}_2a_3$--.

Col. 5, line 68, change "$a_1a_2 + a_0a_1a_3 + a_0a_2a_3$" to --$a_1\bar{a}_2 + a_0\bar{a}_1a_3 + a_0a_2\bar{a}_3$--.

Col. 7, line 28, after "comprising:" start a new paragraph.

Signed and Sealed this

Twenty-first Day of February, 1995

Attest:

BRUCE LEHMAN

Attesting Officer    Commissioner of Patents and Trademarks